(12) United States Patent
Chehade et al.

(10) Patent No.: US 12,745,375 B2
(45) Date of Patent: Sep. 22, 2026

(54) DRY COOLING ARRANGEMENT FOR A DATACENTER

(71) Applicant: OVH, Roubaix (FR)

(72) Inventors: Ali Chehade, Moncheaux (FR); Mohamad Hnayno, Roubaix (FR); Charbel Masri, Lille (FR)

(73) Assignee: OVH, Roubaix (FR)

( * ) Notice: Subject to any disclaimer, the term of this patent is extended or adjusted under 35 U.S.C. 154(b) by 155 days.

(21) Appl. No.: 18/754,730

(22) Filed: Jun. 26, 2024

(65) Prior Publication Data

US 2025/0008701 A1 Jan. 2, 2025

(30) Foreign Application Priority Data

Jun. 28, 2023 (EP) .................................... 23306055

(51) Int. Cl.
*H05K 7/20* (2006.01)

(52) U.S. Cl.
CPC ..... *H05K 7/20836* (2013.01); *H05K 7/20327* (2013.01); *H05K 7/2079* (2013.01); *H05K 7/20827* (2013.01)

(58) Field of Classification Search
None
See application file for complete search history.

(56) References Cited

U.S. PATENT DOCUMENTS 10,132,577 B2 * 11/2018 Martell ..................... F28B 9/04
10,488,061 B2 * 11/2019 Costakis ................. F24F 5/001
10,619,898 B2 * 4/2020 Hollander ............. F24F 5/0035
10,948,223 B2 * 3/2021 Tolouei Asbforoushani ............... F25B 39/022
11,284,544 B1 3/2022 Lingle et al.
(Continued)

FOREIGN PATENT DOCUMENTS

CN 103307699 A 9/2013
CN 108413528 A 8/2018
(Continued)

OTHER PUBLICATIONS

European Search Report to the counterpart EP Patent Application No. EP 23306055.7 completed on Nov. 22, 2023.
(Continued)

*Primary Examiner* — Robert J Hoffberg
(74) *Attorney, Agent, or Firm* — BCF LLP

(57) ABSTRACT

A datacenter dry cooling system for cooling a heat generating source is presented that incorporates a first closed loop arrangement including an air-to-liquid heat exchanger to re-cool heat imparted onto the first cooling fluid, and a first pump that forwards the re-cooled first cooling fluid to the heat generating source. A second cooling fluid open loop arrangement that conveys a second cooling fluid via a second pump to supply the second cooling fluid onto an evaporating pad of an air-to-liquid heat exchanger for cooling dampening. The system also incorporates at least one fan to cause an air flow through the evaporating pad and the first air-to-liquid heat exchanger along with an electronic controller to manage and control the flow rates of the first and second pumps, the flow rate of the second cooling fluid valve, and/or a rotation speed of the at least one fan.

14 Claims, 5 Drawing Sheets

(56) References Cited

U.S. PATENT DOCUMENTS

| | | | | |
|---|---|---|---|---|
| 11,768,035 | B2 * | 9/2023 | Hnayno | F28D 5/00 261/146 |
| 12,287,120 | B2 * | 4/2025 | Benedetti | F24F 13/30 |
| 12,426,214 | B1 * | 9/2025 | Spinazzola | H05K 7/20745 |
| 2010/0162737 | A1 * | 7/2010 | Hall | F24F 6/043 62/310 |
| 2018/0231264 | A1 * | 8/2018 | Vadder | F28B 5/00 |
| 2022/0026095 | A1 * | 1/2022 | Abdel-Salam | F24F 1/039 |
| 2023/0417494 | A1 * | 12/2023 | Xu | F25B 25/005 |
| 2025/0008701 | A1 * | 1/2025 | Chehade | H05K 7/20809 |
| 2025/0056771 | A1 * | 2/2025 | Chehade | H05K 7/20209 |
| 2025/0056772 | A1 * | 2/2025 | Chehade | H05K 7/20272 |
| 2025/0071953 | A1 * | 2/2025 | Chehade | H05K 7/2079 |
| 2025/0081394 | A1 * | 3/2025 | Chehade | H05K 7/20772 |
| 2025/0164193 | A1 * | 5/2025 | Xu | F25B 25/005 |
| 2025/0380388 | A1 * | 12/2025 | Spinazzola | H05K 7/2079 |
| 2026/0006752 | A1 * | 1/2026 | Chehade | H05K 7/20381 |
| 2026/0040504 | A1 * | 2/2026 | Chehade | H05K 7/20827 |
| 2026/0063380 | A1 * | 3/2026 | Rutherford | F28C 1/14 |

FOREIGN PATENT DOCUMENTS

| | | | |
|---|---|---|---|
| CN | 115968162 | A | 4/2023 |
| CN | 121463382 | A | 2/2026 |
| EP | 4098964 | A1 | 12/2022 |
| WO | 2020124261 | A1 | 6/2020 |

OTHER PUBLICATIONS

Office Action with regard to the CN Patent Application No. 202411039811.2 mailed Aug. 6, 2026.

* cited by examiner

DRY COOLING ARRANGEMENT FOR A DATACENTER

CROSS REFERENCE

The present application claims priority to EP application Ser. No. 23/306,055.7 entitled "DRY COOLING ARRANGEMENT FOR A DATACENTER", filed Jun. 28, 2023, the entirety of which is incorporated herein by reference.

FIELD

The present technology generally relates to the field of datacenter cooling measures and, in particular, to a dry cooling arrangement for datacenter rack-mounted assemblies.

BACKGROUND

Dry coolers and other heat exchanger systems operate to dissipate thermal energy from a cooling fluid (e.g., water) circulating therethrough to the ambient environment. For example, in a datacenter, a dry cooler can be used to cool heated water extracted from within the datacenter (e.g., water circulated through water blocks coupled to heat-generating electronic components).

In order to improve the efficiency of heat exchanger systems, some arrangements implement direct spraying evaporative techniques that lower the temperature (i.e., pre-cool) of ambient air that flows through the heat exchanger system. For example, in some cases, a water spraying system (i.e., an atomizer) is placed at the air inlet of a dry cooler to spray water and increase the humidity level of the ambient air, thereby reducing its temperature. Other adiabatic cooling implementations are also available including, for instance, evaporating pads in which water is applied to ambient air prior to entering the heat exchanger system.

However, these cooling implementations may have some drawbacks. For instance, using direct spraying techniques may consume a large volume of water, which negatively impacts the Water Usage Effectiveness (WUE) of such techniques and may also promote the dispersion of pathogenic bacteria, such as *Legionella*. Moreover, evaporating pads can obstruct the flow of ambient air entering therethrough that may result in increased power consumption and noise emissions by the heat exchanger system.

Therefore, even though the cooling implementations and techniques noted above provide certain benefits, further improvements that can alleviate at least some of the drawbacks are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on certain drawbacks associated with conventional dry cooling techniques and implementations.

In one aspect of the inventive concepts of the present technology provide a datacenter dry cooling system for cooling a heat generating source, comprising a first closed loop arrangement configured to convey and circulate a first cooling fluid through the heat generating source, the first closed loop arrangement comprising an air-to-liquid heat exchanger adapted to receive the circulating first cooling fluid from the heat generating source and configured to dissipate the heat imparted on the first cooling fluid by the heat generating source to re-cool the first cooling fluid, and a first pump adapted to receive the re-cooled first cooling fluid from the air-to-liquid heat exchanger and forward the re-cooled first cooling fluid to the heat generating source.

The datacenter dry cooling system further comprises a second cooling fluid open loop arrangement configured to convey a second cooling fluid from a second cooling fluid source, the second cooling fluid open loop arrangement comprising a second fluid access component adapted to supply a flow of the second cooling fluid from the second cooling fluid source to the second cooling fluid open loop arrangement, a second cooling fluid valve fluidly coupled to the second cooling fluid open loop arrangement to provide the flow of the second cooling fluid onto an evaporating pad, in which the evaporating pad disposed at an input airflow side of the air-to-liquid heat exchanger and adapted to receive the flow of the second cooling fluid for cooling dampening, at least one fan adapted for causing an air flow through the evaporating pad and through the first air-to-liquid heat exchanger; and an electronic controller configured to manage and control a pumping flow rate of the first pump, second fluid access component, a flow rate of the second cooling fluid valve, and/or a rotation speed of the at least one fan.

The datacenter dry cooling system further including at least a second temperature sensor configured to detect a temperature of the airflow entering the evaporating pad, and a leak detector sensor configured to detect fluid leakages from the evaporating pad, wherein the first temperature sensor, the second temperature sensor, and the leak detector are communicatively coupled to the electronic controller.

The datacenter dry cooling system may further incorporate one or more sensors detecting the heat exchanger air inlet/outlet temperatures, the evaporative cooling pad inlet/outlet temperatures, fan air outlet temperature, water outlet temperature, and a sensor for detecting humidity levels, in which of each of the sensors are communicatively coupled to the electronic controller.

The datacenter dry cooling system may also incorporate delta pressure sensors configured to detect airflow loss throughout the heat exchanger based on compromised evaporative cooling pads due to dirt or clogging, in which the delta pressure sensors communicate an alert message.

The datacenter dry cooling system may also implement one or more solar panels configured to convert solar energy into electrical energy and one or more rechargeable battery sets electrically coupled to the solar panels to receive the electrical energy from the one or more solar panel, wherein the one or more rechargeable battery sets operate to power at least one of: the temperature sensors, leak detector sensor, and the electronic controller.

In a related aspect of the inventive concepts of the present technology provides, a datacenter dry cooling method for cooling a heat generating source, in which the method causes a circulating flow of a first cooling fluid in a first closed loop arrangement through the heat generating source, the first closed loop arrangement implementing an air-to-liquid heat exchanger receiving the circulating first cooling fluid from the heat generating source and dissipating the heat imparted on the first cooling fluid by the heat generating source to re-cool the first cooling fluid, and a first pump receiving the re-cooled first cooling fluid from the air-to-liquid heat exchanger and forwarding the re-cooled first cooling fluid to the heat generating source. The dry cooling method further causing a circulating flow of a second cooling fluid in a second open loop arrangement that implements a second pump supplying a flow of the second cooling fluid from a second cooling fluid source to the second cooling fluid open loop arrangement, a second cooling fluid valve fluidly coupled to the second cooling fluid open loop arrangement for providing the flow of the second cooling fluid onto an evaporating pad, and the evaporating pad disposed at an input airflow side of the air-to-liquid heat exchanger for receiving the provided flow of the second cooling fluid for cooling dampening.

The dry cooling method further comprising at least one fan adapted for causing an air flow through the evaporating pad and through the first air-to-liquid heat exchanger and providing an electronic controller for managing and controlling a pumping flow rate of the first and second pumps, a flow rate of the second cooling fluid valve, and a rotation speed of the at least one fan.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1A:
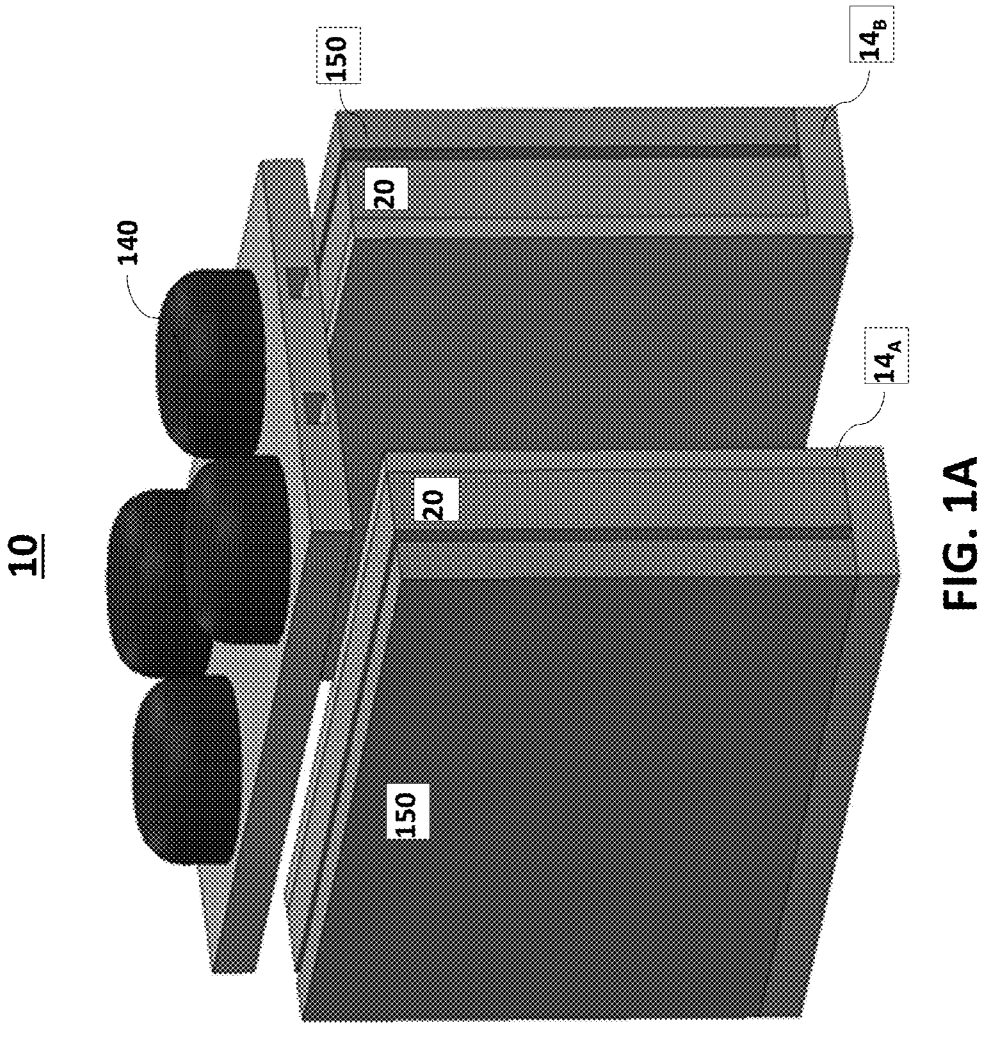
FIG. 1A illustrates a conceptual representation of a dry cooler, in accordance with the nonlimiting embodiments of the present technology.

It should be appreciated that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

The functions of the various elements shown in the FIGs. including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In certain aspects, the present technology provides a cooling arrangement. The cooling arrangement comprises a closed loop, a semi-open loop, and at least one fan. The closed loop comprises a primary side of a liquid-to-liquid heat exchanger, the primary side being receiving a first cooling fluid from a heat source, for instance heat generating units of a datacenter. The first cooling fluid may be, for example, water or any other suitable cooling fluid. The closed loop also comprises an air-to-liquid heat exchanger receiving the first cooling fluid from the primary side of the liquid-to-liquid heat exchanger. The air-to-liquid heat exchanger may be, for instance, a part of a dry cooler. The closed loop also comprises a first pump receiving the first cooling fluid from the air-to-liquid heat exchanger and returning the first cooling fluid to the heat source. The semi-open loop may also comprise a tank storing and supply a second cooling fluid or may also be configured to directly receive a second cooling fluid from a local municipal water source. The second cooling fluid may be, for example, water or any other suitable cooling fluid. The semi-open loop also comprises a second pump drawing the second cooling fluid from the tank and a secondary side of the liquid-to-liquid heat exchanger. The secondary side receives the second cooling fluid from the second pump. The semi-open loop also comprises an evaporating pad receiving the second cooling fluid from the secondary side of the liquid-to-liquid heat exchanger and returning at least a portion of the second cooling fluid to the tank, and an inlet fluidly connected to a source of the second cooling fluid, the inlet being controlled for maintaining a level of the second cooling fluid in the tank. The cooling arrangement comprises at least one fan causing outside air to flow through the evaporating pad and through the air-to-liquid heat exchanger.

Given this fundamental understanding, attention is directed to some non-limiting examples to illustrate various implementations of aspects of the present technology.

In a non-limiting embodiment of the present technology, a cooling arrangement includes a distribution system for watering an evaporating pad used for cooling a cooling fluid via a liquid-to-liquid heat exchanger. The liquid-to-liquid heat exchanger may be, for example and without limitation, a plate heat-exchanger (PHEX). The distribution system is a semi-open loop where water streaming down the evaporating pad is collected in a tank where it may be cooled with low-temperature makeup water such as, for instance and without limitation, tap water. The distribution system pumps cooled water from the tank into the liquid-to-liquid heat exchanger where thermal energy is transferred from the cooling fluid arriving from the heat source, for example and without limitations a datacenter, to the water entering the PHEX from the tank. Cooling fluid arriving from the heat source is thus pre-cooled and enters an air-to-liquid heat exchanger such as, for example and without limitation, a heat exchanger panel of a dry cooler, and is cooled down by air pulled by one or more fans through the air-to-liquid heat exchanger. For instance, and without limitation, the air-to-liquid heat exchanger may part of a dry cooler comprising fans to pull ambient air through the air-to-liquid heat exchanger. Thermal energy is thus transferred from the pre-cooled cooling fluid to the atmosphere so that the pre-cooled cooling fluid is recirculated back to the heat source.

The additional pre-cooling of the cooling fluid arriving from the heat source at the PHEX uses the distribution system. As a result, efficient cooling may be obtained with reduced air flow on the evaporating pad and through the dry cooler. An electrical consumption and a noise emission of fans of the dry cooler may thus be reduced. As it will be described in greater details herein further below, even a small ratio of the thermal dissipation acting on the PHEX is sufficient to significantly reduce the fan's electrical consumption and noise emission.

With this said, FIG. 1A illustrates a conceptual representation of a dry cooler 10, in accordance with the nonlimiting embodiments of the present technology. The dry cooler 10 may be located on any suitable support surface, such as, for example, the roof of a datacenter building. As shown, dry cooler 10 comprises the following components: at least one heat exchanger 20, at least one fan assembly 140, and at least one evaporating pad 150. These components along with elements of the nonlimiting embodiments will be described in greater detail below.

In certain nonlimiting embodiments, the dry cooler 10 may include a first frame $\mathbf{14}_A$ and a second frame $\mathbf{14}_B$, each of the first and the second frames supporting, in use a heat exchanger 20 and an evaporating pad 150 disposed externally to the heat exchanger 20. The first and the second frames $\mathbf{14}_A$, $\mathbf{14}_B$ extend vertically and support the fan assembly 140 that is connected thereto. As shown, the first and the second frames $\mathbf{14}_A$, $\mathbf{14}_B$ are in a spaced-apart configuration and extend substantially parallel to one another. It will be appreciated that, while the dry cooler 10 is depicted as manifesting a certain shape and configuration, the depicted shape and configuration is simply an example, as other dry cooler shapes and configurations equally apply to the overall inventive concept, such as, for example, V-shaped dry cooler designs, semi V-shaped dry cooler designs, vertically-arranged dry cooler designs, horizontally-arranged dry cooler designs, etc.

Regardless of the specific overall dry cooler design, the frames $\mathbf{14}_A$, $\mathbf{14}_B$ of the dry cooler 10 are to be anchored to any suitable support surface (e.g., a ground surface) by fasteners. For instance, the support surface may be a surface surrounding the datacenter building or a roof of the datacenter building. However, in other implementation examples, the support surface may be part of a structure purposefully built to support the frames $\mathbf{14}_A$, $\mathbf{14}_B$ of the dry cooler 10.

Figure 1B:
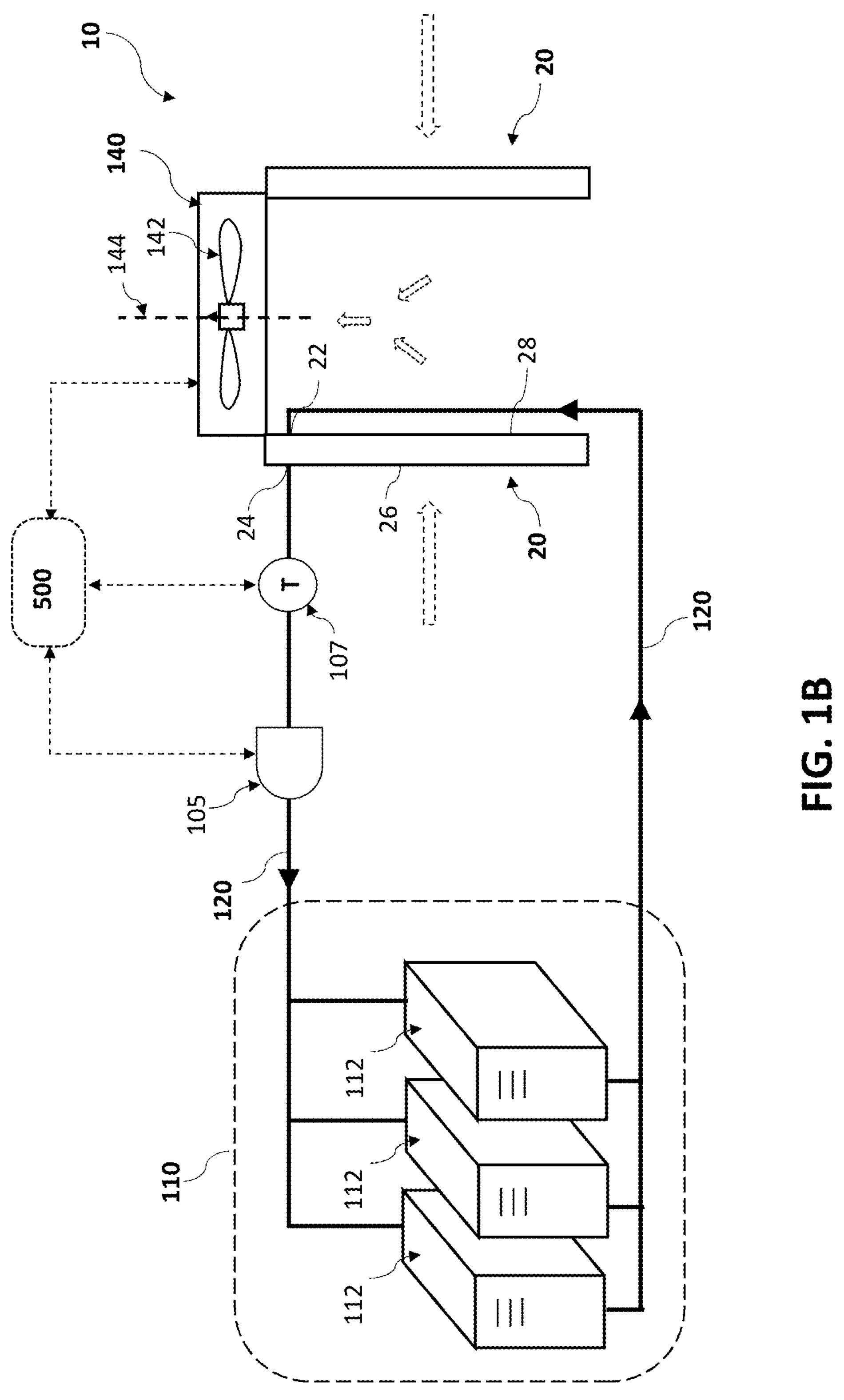
FIG. 1B illustrates a high-level functional block diagram of dry cooling arrangement for a heat source, in accordance with the nonlimiting embodiments of the present technology.

FIG. 1B illustrates a high-level functional block diagram of dry cooling arrangement 100 that provides cooling to a heat source 110 generating thermal energy, in accordance with the nonlimiting embodiments of the present technology. The heat source 110 may be a plurality of heat generating electronic processing components 112 (e.g., processing servers) housed by a datacenter. For tractability and clarification purposes, the details of frames $14_A$, $14_B$ and cooling pads 150 are not depicted in FIG. 1B.

As shown, the dry cooling arrangement 100 comprises a first cooling fluid closed loop 120, in which a first cooling fluid circulates therein to extract the thermal energy generated by the heat source 110 (e.g., processing servers 112) and carries the extracted thermal energy to a heat-exchanging dry cooler 10 that dissipates the thermal energy to re-cool the first cooling fluid. A pump 105 may be used to circulate the re-cooled first cooling fluid from the dry cooler 10 back to the heat source 110. It will be appreciated that the first cooling fluid circulated by first cooling fluid closed loop 120 may comprise water, dielectric fluid, refrigerant fluid, diphasic fluid, or any other fluid suitable for collecting and discharging thermal energy.

In the depicted embodiment of FIG. 1B, the first cooling fluid closed loop 120 includes one of the heat exchangers 20 of the dry cooler 10. The other the heat exchanger 20 may be included in another cooling fluid closed loop for cooling another heat source. In certain other embodiments, the first cooling fluid closed loop 120 may include both of the heat exchangers 20 of the dry cooler 10 that are arranged in either a parallel or serial configuration. Again for the purposes of tractability and clarity, the following description is made with respect to one of the heat exchangers 20 and a corresponding cooling pad 150 of the dry cooler 10. However, it will be understood that the following description equally applies to the other heat exchangers 20 and corresponding cooling pads 150 configurations.

In the depicted embodiment of FIG. 1B, the dry cooler 10 comprises a heat exchanger panel 20 for discharging thermal energy of the first cooling fluid into the atmosphere. In this illustrative example, the heat exchanger panel 20 is a liquid-to-air heat exchanger panel 20 that transfers the thermal energy from the circulating first cooling fluid to the air flowing therethrough. As shown in FIG. 1B, the heat exchanger panel 20 has an air inlet side 26 and an air outlet side 28 through which ambient air enters into, and exits out of, the heat exchanger panel 20, respectively.

The liquid-to-air heat heat exchanger panel 20 comprises a cooling coil (not shown) for circulating the first cooling fluid therein and may define a plurality of fins (not shown) in thermal contact with the cooling coil. As depicted in FIG. 1B, the cooling coil incorporates a fluid inlet 22 for supplying the first cooling fluid into the cooling coil and a fluid outlet 24 for discharging the heat transfer fluid from the cooling coil. The fins may be spaced from one another for air to flow therebetween, from the air inlet side 26 to the air outlet side 28.

In some embodiments, the fan assembly 140 is connected to the frame (e.g., the frames $14_A$, $14_B$) and produces an air flow through the dry cooler 10. In particular, the fan assembly 140 comprises a plurality of fans 142 (one of which is shown in FIG. 1B) located at an upper end of the dry cooler 10. In this example, the fans 142 are rotatable about respective vertical axes 144. It will be appreciated that other implementations are contemplated, such as, for example, the fans 142 may be configured to produce air flow directed to cooling pad 150 of the dry cooler 10, so as to enable the air flow to directly interact with the heat exchangers 20.

The fan assembly 140 may include respective motors (not shown) driving each of the fans 142 to cause rotation of the fans 142 about their respective axes 144. Thus, as denoted by the dashed air flow arrows in FIG. 1B, the fan assembly 140 pulls in ambient air from a lateral side of the dry cooler 10, through the heat exchanger panel 20, and dissipates heated air through the fan assembly 140 out into the ambient environment vertically above the dry cooler 10.

As such, the dry cooler 10 operates to forward the heated first cooling fluid extracted from the heat source 110 (e.g., processing servers 112) through the cooling coils of the heat exchanger panel 20, while simultaneously pulling in ambient air between the fins and around the cooling coil of the heat exchanger panel 20. The ambient air absorbs heat from the heated first cooling fluid circulating through the cooling coils and, as ambient air is pulled in through the heat exchanger panel 20 into an interior space of the dry cooler 10, the thermal energy is transferred from the first cooling fluid circulating in the heat exchanger panel 20 to the ambient air. That is, the currently-heated air is discharged from the interior space of the dry cooler 10 via the air flow produced by fan assembly 140 to the ambient air.

The first cooling fluid circulating through the heat exchanger panel 20 is thus re-cooled and circulated back to the heat source 110. In the illustrated embodiment, the first cooling fluid closed loop 120 further comprises a temperature sensor 107 that detects the temperature of the first cooling fluid at the fluid outlet 24 of the heat exchanger panel 20. The temperature sensor 107 may be communicatively coupled to an electronic controller 500 for controlling the pump flow rate of the first pump 105 and/or the rotational speed of the fan 142 in response to the detected temperature of the first cooling fluid. For example, if temperature sensor 107 detects that the temperature of the first cooling fluid exceeds a high temperature threshold, the electronic controller 500 may increase the pump flow rate of the first pump 105 and/or the rotational speed of the fan 142 to increase the cooling capacity of the dry cooler 10. Depending on the specific implementation of the water cooling and/or air measures, the high temperature threshold may be set at approximately 35° C. to approximately 45° C.

Figure 2:
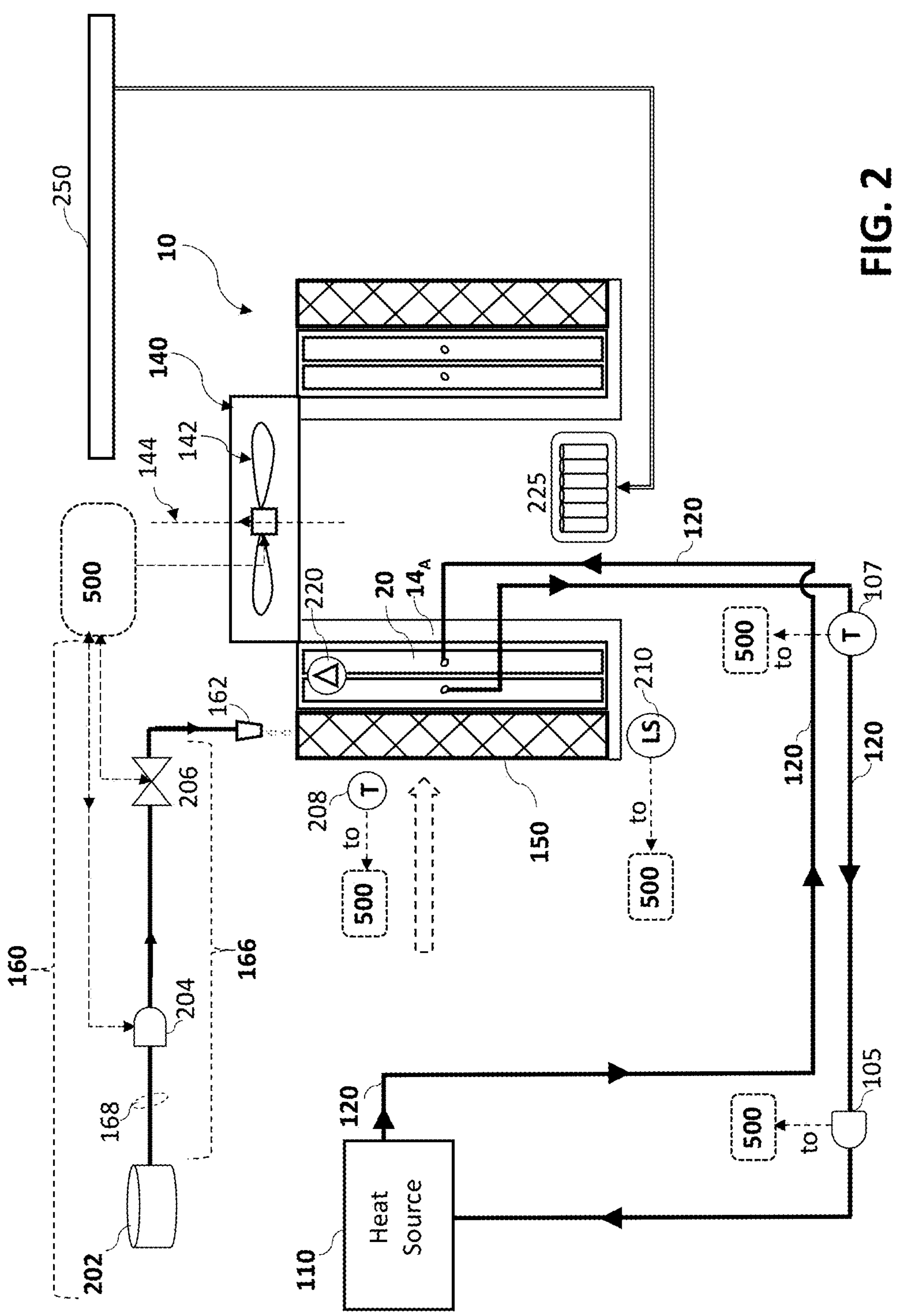
FIG. 2 illustrates an adiabatic dry cooling system, in accordance with the nonlimiting embodiments of the present technology.

FIG. 2 illustrates an adiabatic dry cooling system 200, in accordance with the nonlimiting embodiments of the present technology. The adiabatic cooling system 200 incorporates an evaporating pad 150 and a distribution system 160 for the controlled spraying or dripping of a second cooling fluid onto the evaporating pad 150 to dampen the cooling evaporating pad 150. The second cooling fluid may be water or other suitable liquids, possibly with additives such as polyethylene glycol (PEG) and/or polypropylene glycol (PPG).

The distribution system 160 comprises a second cooling fluid open loop 166 manifesting a conduit 168 for conveying the second cooling fluid, a second cooling fluid supply source 202, a pump 204 for urging the second cooling fluid through the conduit 168, a valve 206 for controlling the flow of the second cooling fluid, a nozzle 162 for distributing (e.g., spraying/dripping) the second cooling fluid onto the evaporating pad 150 (e.g., onto a top portion thereof) for dampening purposes, a temperature sensor 208 for detecting the temperature of the air flow entering the evaporating pad 150, and/or a temperature sensor for detecting the temperature of the air flow exiting the evaporating pad 150, and a fluid leak sensor 210 for detecting any second cooling fluid moisture leaking from the evaporating pad 150. The valve 206 may comprise a temperature responsive pressure independent control valve ((PICV)) or a pressure independent control valve with a built-in, integrated differential pressure regulator ((ABQM™) valve to automatically adjust to system pressure changes from valves opening and closing.

The cooling evaporating pad 150 is disposed on a lateral side of the dry cooler 10. In one embodiment, the frame 14 of the dry cooler 10 comprises an enclosure that integrates the evaporating pad 150 onto a lateral side of the dry cooler 10, such that the ambient air that is pulled in by the dry cooler fan 142 first passes through the cooling evaporating pad 150 and then passes to the heat exchanger panel 20.

The evaporating pad 150 is designed with a structured pattern that facilitates the flow of ambient air therethrough. Accordingly, the evaporating pad 150 structure may comprise a mesh, web, honeycomb, or other suitable patterns. Additionally, the evaporating pad 150 structure may be made of plastic material, cellulose, or glass fibers, but other materials are also contemplated in alternative embodiments.

The distribution system 160 operates to provide the controlled spraying/dripping of the second cooling fluid to dampen the evaporating pad 150. In certain embodiments, the distribution system 160 may further incorporate a flow sensor (not shown) to assist in quantifying the exact flow rate needed for evaporation. As such, ambient air flows through the dampened evaporating pad 150. The temperature of the ambient air flowing through the evaporating pad 150 is thus reduced (i.e., cooled), as a portion of the second cooling fluid (e.g., water droplets) distributed onto the evaporating pad 150 evaporates. In turn, the thermal energy of the ambient air is absorbed via evaporation of the portion of the dampened evaporating pad 150 so that the temperature of the ambient air flow is reduced.

The distribution system 160 of the adiabatic dry cooling system 200 is configured to convey the second cooling fluid from the supply source 202 to the nozzle 162 via the second cooling fluid open loop 166. In particular, pump 204 forwards the second cooling fluid from the supply source 202 to the valve 206 along open loop 166. The valve 206 controls the flow rate of the second cooling fluid to be sprayed/dripped onto the evaporating pad 150. Accordingly, pump 204 and valve 206 are configured to be communicatively-coupled to electronic controller 500, in which electronic controller 500 manages and controls valve 206 to provide an optimal second cooling fluid flow rate based on the data collected from other relevant communicatively-coupled elements of the adiabatic dry cooling system 200, such as, for example, temperature sensor 208 and fluid leak sensor 210.

Relatedly, temperature sensor 208 is configured to detect the temperature of the air flow entering the evaporating pad 150. Depending on the geographic location, the high and low temperature limits detected by temperature sensor 208 may range from approximately −40° C. to approximately 60° C. The temperature sensor 208 is communicatively-coupled to the electronic controller 500 to report the detected temperature of the air received by evaporating pad 150. Relatedly, in certain implementations, a humidity sensor (not shown) may be collocated with temperature sensor 208 or a combined temperature/humidity sensor may be implemented to assist in quantifying the exact water measure needed for cooling.

Moreover, fluid leak sensor 210 is configured to detect any level of second cooling fluid moisture leaking from the evaporating pad 150. The fluid leak sensor 210 is communicatively-coupled to the electronic controller 500 to report any detected moisture leakages. Depending on the implementation and associated requirements, it may be acceptable to sustain a maximum leakage volume over a predetermined time period of approximately 5% to approximately 10% of the total water flow.

As discussed above relative to FIG. 1B, the electronic controller 500 controls the pump flow rate of the first pump 105 and/or the rotational speed of the fan 142 in response to the detected temperature of the first cooling fluid. In similar fashion, the electronic controller 500 adjusts and controls the second cooling fluid flow rate of valve 206 and/or the pump flow rate of the pump 204 based on the detected temperature data of the air flow entering evaporating pad 150 reported by the temperature sensor 208 and the detected second cooling fluid moisture leakage data reported by the fluid leak sensor 210. It will be appreciated that temperatures and relative humidity of other areas of dry cooling system 200 may be detected to contribute to the adjustment and control of the fluid flow rate of valve 206 and/or the pump flow rate of the pump 204. As such, other temperature and relative humidity sensors (not shown) may be implemented to detect, for example, heat exchanger 20 air inlet/outlet temperatures, evaporative cooling pad 150 inlet/outlet temperatures, relative humidity sensors before and/or after the evaporative cooling pad 150, fan air outlet temperature, water outlet temperature, etc.

The determined electronic controller 500 adjustment and control of the second cooling fluid flow rate of valve 206 and/or the pump flow rate of the pump 204 may be based on the detected data of: temperature sensor 208, heat exchanger 20 air inlet/outlet temperatures, evaporative cooling pad 150 inlet/outlet temperatures, fan air outlet temperature, water outlet temperature, and fluid leak sensor 210. This data may further be combined with the detected temperature of the first cooling fluid, the detected first pump 105 flow rate, and the rotational speed of the fan 142 to determine the timely and accurate adjustment/control of cooling fluid flow rate of valve 206 and/or the pump flow rate of the pump 204.

In operation, the electronic controller 500 is configured to determine a target amount of second cooling liquid to be sprayed/dripped onto the cooling pad 150, such that the second cooling liquid substantially, if not totally, evaporates on the cooling pad 150 before reaching a bottom of the cooling pad 150 while providing enough cooling of the ambient air to be pulled therethrough. For example, the electronic controller 500 may reduce the amount of second cooling fluid sprayed/dripped onto the cooling pad 150 in response to the fluid leak sensor 210 detecting moisture leakage that exceeds approximately 5% of the total water flow. As another example, the electronic controller 500 may increase the amount of second cooling fluid sprayed/dripped onto the cooling pad 150 in response to temperature sensor 208 detecting a rise of the ambient air temperature.

Returning back to FIG. 2, the dry cooling system 200 may also include one or more delta pressure sensors 220 configured to determine whether there is a loss in airflow throughout the heat exchanger panels 20 due to compromised evaporative cooling pads 150. Compromised evaporative cooling pads 150 may be due to clogged or dirty evaporative cooling pads 150 that can lead to decreased evaporation rates and increased water leakage. The delta pressure sensors 220 may further be configured to communicate with the electronic controller 500 to transmit an alert message to clean or replace the clogged/dirty evaporative cooling pads 150.

In certain implementations, the dry cooling system 200 may further implement one or more solar panels 250 and one or more rechargeable battery sets 225 that are electrically coupled to the solar panels 250. The solar panels 250 may disposed on a datacenter roof or other location providing optimal sunlight exposure to convert solar energy into electrical energy. The rechargeable battery sets 225 may be disposed between the air-to-liquid heat exchanger panels 20 and may further be structured to contain any minor leakages. In this manner, the converted electrical energy provided by the solar panels 250 is forwarded to, and stored by the rechargeable battery sets 225. In turn, the electrical energy stored by the rechargeable battery sets 225 may be used to power the various sensors, electronic controller 500, and second pump 204 by virtue of a DC/AC inverter.

Figure 3:
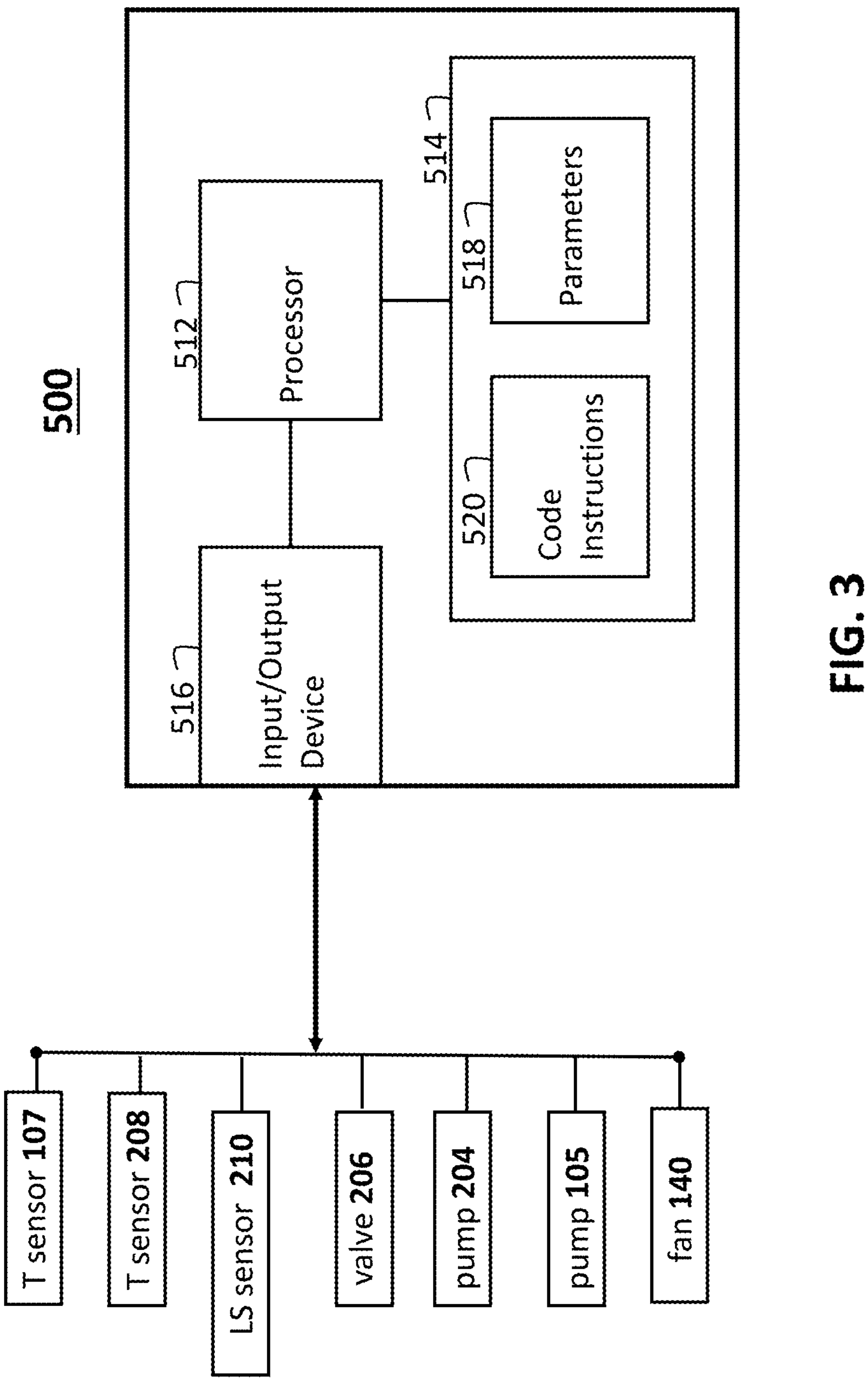
FIG. 3 illustrates a functional block diagram of electronic controller, in accordance with the nonlimiting embodiments of the present technology.

FIG. 3 illustrates a functional block diagram of electronic controller 500, in accordance with an embodiment of the present technology. As shown, the controller 500 comprises a processor or a plurality of cooperating processors (represented as a processor 512 for simplicity), a memory device or a plurality of memory devices (represented as a memory device 514 for simplicity), one or more input devices and one or more output devices, the input devices and the output devices being possibly combined in one or more input/output devices (represented as a single input/output device 516 for simplicity). The processor 512 is operatively connected to the memory device 514 and to the input/output device 516. The memory device is configured to store a list 518 of parameters, including for example, relevant temperature, humidity, and leakage amount thresholds, of which only a few of the sensors discussed above are depicted for the sake of brevity. The memory device 514 may comprise a non-transitory computer-readable media for storing control logic instructions 520 that are executable by the processor 512.

The processor 512 is communicatively coupled, via the input/output interface 516, to the temperature sensors 107 and 208, to leak detection sensor 210 as well as operatively coupled to valve 206, to pumps 204 and 105, and to the at least one fan assembly 140, for adjustment and control of elements that may be present in a particular embodiment. The processor 512 is configured to execute the control logic instructions 520 stored in the memory device 514 to implement the various above-described functions of the controller 500.

It will be appreciated that in certain embodiments, the control logic instructions 520 of processor 512 may be further configured to evaluate the detected data received from the sensors 107, 208, 210 over a period of time to provide predictive and/or recommended operating control parameters of operatively coupled elements such as valve 206, pumps 204 and 105, and fan assembly 140.

The depicted embodiment is not meant to limit the present disclosure and is provided for illustration purposes. As such, only some of the sensors, valves, pumps, or fan may be implemented in a particular embodiment.

Figure 4:
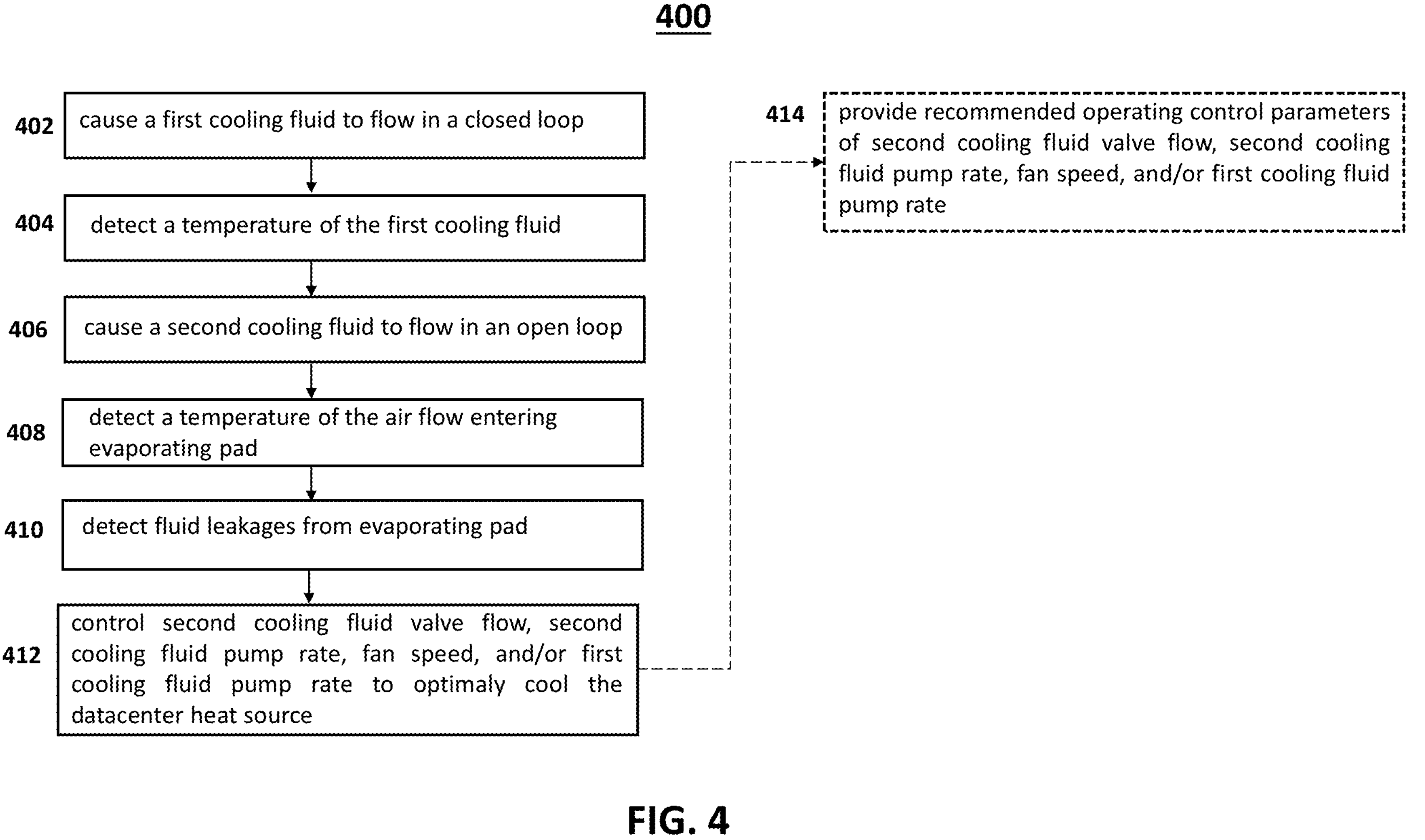
FIG. 4 illustrates a functional flow diagram indicating the operations of a method for cooling a heat source, in accordance with non-limiting embodiments of the present technology.

FIG. 4 illustrates a functional flow diagram indicating the operative steps of a process 400 for cooling a heat source, in accordance with non-limiting embodiments of the present technology. The process 400 is configured to be executed by electronic controller 500 in concert with the processor 512, memory device 514, and stored instructions 520 incorporated therein.

Process 400 commences at step 402, in which the first cooling fluid is caused to flow within the first cooling liquid closed loop 120. As noted above, the first cooling fluid circulating within the first cooling liquid closed loop 120 functions to cool the heat source 110 by transferring the thermal energy from the circulating first cooling fluid to the air flowing through the panel 20 and consequently, during datacenter operations, the first cooling fluid is heated by the thermal generating components of heat source 110. Accordingly, at step 404, the temperature of the first cooling fluid is detected, such as, for example, by temperature sensor 107.

At step 406, the second cooling fluid is caused to flow within the second cooling liquid open loop 166. As noted above, the distribution system 160 functions to provide the controlled spraying/dripping of the second cooling fluid to dampen and cool the evaporating pad 150, as ambient air flows therethrough to evaporate distributed second cooling fluid. Accordingly, at step 408, the temperature of the ambient air flow entering the evaporating pad 150 is detected, such as, for example, by temperature sensor 208 and at step 410, fluid leakage amounts from the evaporating pad 150 are detected, such as, for example, by leak sensor 210.

Based on the detected temperature of the first cooling fluid, the detected temperature of the air flow entering evaporating pad, and the detected fluid leakage amounts, at step 412, process 400 determines the controlling adjustments of the flow rate of valve 206 for the second cooling fluid, the pump flow rate of the pump 204 handling the second cooling fluid, the rotational speed of the fan 142, and/or the pump flow rate of the pump 105 handling the first cooling fluid to achieve the optimal cooling of the datacenter heat source 110.

As noted above, the control logic instructions 520 of processor 512 may be configured to evaluate the detected data received from the sensors 107, 208, 210 over a period of time to provide predictive and/or recommended operating control parameters of operatively coupled elements such as valve 206, pumps 204 and 105, and fan assembly 140. In certain implementations, the control logic instructions 520 may incorporate artificial intelligence (AI) methodologies that analyze the operational parameters of all detected sensors over time to provide adjustments/control of related elements to optimize cooling operations based on historical experiences, such as, for example, time of day, weekdays, weekends, different seasons, etc. Accordingly, at step 414, process 400 provides recommended predictive control of second cooling fluid valve flow, second cooling fluid pump rate, fan speed, and/or first cooling fluid pump rate operating parameters.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A datacenter dry cooling system for cooling a heat generating source, comprising:

a first closed loop arrangement configured to convey and circulate a first cooling fluid through the heat generating source, the first closed loop arrangement comprising:

a dry cooler unit comprising a frame enclosing an air-to-liquid heat exchanger and an evaporating pad, the air-to-liquid heat exchanger adapted to receive the circulating first cooling fluid from the heat generating source and configured to dissipate a heat imparted on the first cooling fluid by the heat generating source to re-cool the first cooling fluid, and a first pump adapted to receive the re-cooled first cooling fluid from the air-to-liquid heat exchanger and forward the re-cooled first cooling fluid to the heat generating source;

a second cooling fluid open loop arrangement configured to convey a second cooling fluid from a second cooling fluid source, the second cooling fluid open loop arrangement comprising:

a second fluid access component adapted to supply a flow of the second cooling fluid from the second cooling fluid source to the second cooling fluid open loop arrangement, and a second cooling fluid valve fluidly coupled to the second cooling fluid open loop arrangement to supply the flow of the second cooling fluid onto the evaporating pad, the evaporating pad disposed on an outer lateral side of the frame of the dry cooler unit and at an input airflow side of the air-to-liquid heat exchanger to receive the supplied flow of the second cooling fluid for cooling dampening, at least one fan adapted for causing an air flow through the evaporating pad and through the air-to-liquid heat exchanger, a leak detector sensor configured to detect a leakage amount of the second cooling fluid from the evaporating pad, and an electronic controller communicatively coupled to the first pump, the second fluid access component, the second cooling fluid valve, the at least one fan, and the leak detector sensor, the electronic controller configured to:

determine a target amount of the second cooling fluid to be supplied to the evaporating pad based on the detected second cooling fluid leakage amount from the leak detector sensor; and control, based on the determined second cooling fluid target amount, a flow rate of the first pump, a flow rate of the second fluid access component, a flow rate of the second cooling fluid valve, and/or a rotation speed of the at least one fan.

2. The datacenter dry cooling system of claim 1, wherein the heat generating source comprises a plurality of datacenter rack-mounted electronic processing assemblies.

3. The datacenter dry cooling system of claim 1, wherein the second fluid access component comprises a second pump.

4. The datacenter dry cooling system of claim 1, wherein the second cooling fluid valve comprises a solenoid valve, a pressure independent control valve, or a pressure independent control valve with a built-in, integrated differential pressure regulator.

5. The datacenter dry cooling system of claim 1, further comprising:

a first temperature sensor to detect a temperature of the first cooling fluid at a liquid outlet of the air-to-liquid heat exchanger; and a second temperature sensor configured to detect a temperature of the air flow entering the evaporating pad, wherein the first temperature sensor, the second temperature sensor, and the leak detector sensor are communicatively coupled to the electronic controller.

6. The datacenter dry cooling system of claim 5, wherein the electronic controller further adjusts and controls, based on data provided by the first temperature sensor and the second temperature sensor, any one of the flow rate of the first pump, the flow rate of the second pump, the rotational speed of the at least one fan, and/or the flow rate of the second cooling fluid valve.

7. The datacenter dry cooling system of claim 6, further comprising:

one or more solar panels configured to convert solar energy into electrical energy; and one or more rechargeable battery sets electrically coupled to the solar panels to receive the electrical energy from the one or more solar panels.

8. The datacenter dry cooling system of claim 7, wherein the one or more rechargeable battery sets operate to power at least one of: the first temperature sensor, the second temperature sensor, the leak detector sensor, or the electronic controller.

9. The datacenter dry cooling system of claim 6, further comprising one or more sensors detecting an air inlet temperature of the air-to-liquid heat exchanger, inlet/outlet temperatures of the evaporative pad, an air outlet temperature of the at least one fan, and one or more sensors disposed before and/or after the evaporative pad for detecting humidity levels.

10. The datacenter dry cooling system of claim 5, further comprising one or more delta pressure sensors configured to detect a loss in the air flow through the air-to-liquid heat exchanger due to compromising of the evaporative pad and to communicate an alert message regarding the detected loss of the air flow to the electronic controller.

11. A datacenter dry cooling method for cooling a heat generating source, the method comprising:

causing a circulating flow of a first cooling fluid in a first closed loop arrangement through the heat generating source, the first closed loop arrangement comprising:

a dry cooler unit comprising a frame enclosing an air-to-liquid heat exchanger and an evaporating pad, the air-to-liquid heat exchanger adapted to receive the circulating first cooling fluid from the heat generating source and configured to dissipate a heat imparted on the first cooling fluid by the heat generating source to re-cool the first cooling fluid, and a first pump receiving the re-cooled first cooling fluid from the air-to-liquid heat exchanger and forwarding the re-cooled first cooling fluid to the heat generating source;

causing a circulating flow of a second cooling fluid in a second open loop arrangement, the second open loop arrangement comprising:

a second pump supplying a flow of the second cooling fluid from a second cooling fluid source to the second cooling fluid open loop arrangement, and a second cooling fluid valve fluidly coupled to the second cooling fluid open loop arrangement for supplying the flow of the second cooling fluid onto the evaporating pad;

disposing the evaporating pad on an outer lateral side of the frame of the dry cooler unit and at an input airflow side of the air-to-liquid heat exchanger for receiving the supplied flow of the second cooling fluid for cooling dampening;

providing a leak detector sensor configured to detect a leakage amount of the second cooling fluid from the evaporating pad;

providing at least one fan adapted for causing an air flow through the evaporating pad and through the air-to-liquid heat exchanger; and providing an electronic controller, communicatively coupled to the first pump, the second pump, the second cooling fluid valve, the at least one fan, and the leak detector sensor, the electronic controller operative to:

determine a target amount of the second cooling fluid to be supplied to the evaporating pad based on the detected second cooling fluid leakage amount from the leak detector sensor; and control, based on the determined second cooling fluid target amount, a flow rate of the first pump, a flow rate of the second pump, a flow rate of the second cooling fluid valve, and/or a rotation speed of the at least one fan.

12. The datacenter dry cooling method of claim 11, further comprising:

arranging the communicative coupling of the electronic controller to the first pump, the, the second cooling fluid valve, and the at least one fan.

13. The datacenter dry cooling method of claim 11, further comprising:

implementing a first temperature sensor for detecting a temperature of the first cooling fluid at an outlet of the air-to-liquid heat exchanger; and implementing a second temperature sensor for detecting a temperature of the air flow entering the evaporating pad, wherein the first temperature sensor and the second temperature sensor are communicatively coupled to the electronic controller.

14. The datacenter dry cooling method of claim 13, wherein the electronic controller further adjusts and controls, based on data provided by the first temperature sensor and the second temperature sensor, any one of the flow rate of the first pump, the flow rate of the second pump, the rotational speed of the at least one fan, and/or the flow rate of the second cooling fluid valve.

* * * * *